United States Patent [19]
Lee et al.

[11] Patent Number: 5,872,391
[45] Date of Patent: Feb. 16, 1999

[54] BIPOLAR JUNCTION TRANSISTORS HAVING AN INCREASED SAFE OPERATING AREA

[75] Inventors: Sang-yong Lee, Kyungki-do; Soo-seong Kim, Seoul; Jun-soo Kim, Incheon-si, all of Rep. of Korea

[73] Assignee: Samsung Electronics Co., Ltd., Kyungki-do, Rep. of Korea

[21] Appl. No.: 674,092

[22] Filed: Jul. 1, 1996

[30] Foreign Application Priority Data

Oct. 10, 1995 [KR] Rep. of Korea .................. 1995 34699

[51] Int. Cl.$^6$ .......................... H01L 27/082; H01L 27/02; H01L 29/70
[52] U.S. Cl. ........................... 257/578; 257/587; 257/591
[58] Field of Search .................................. 257/591, 592, 257/578, 579, 565, 571, 575, 587

[56] References Cited

U.S. PATENT DOCUMENTS

| | | | |
|---|---|---|---|
| 4,388,634 | 6/1983 | Amantea et al. | 357/34 |
| 4,416,708 | 11/1983 | Abdoulin et al. | 148/187 |
| 5,237,200 | 8/1993 | Nanba et al. | 257/592 |

*Primary Examiner*—Wael Fahmy
*Attorney, Agent, or Firm*—Myers Bigel Sibley & Sajovec

[57] ABSTRACT

A bipolar junction transistor includes a semiconductor substrate having a surface, a base region of first conductivity type in the substrate, and an emitter region of second conductivity type extending from the surface into the base region to form a generally concave semiconductor junction having an apex oriented towards the surface. The emitter region preferably includes a plurality of contiguous emitter subregions extending from the surface into the base region in an arcuate manner and merging to form the generally concave semiconductor junction. The transistor preferably includes an emitter terminal electrically contacting the emitter region at an emitter contact area on the surface, the emitter contact area having a central portion substantially centered with respect to the apex of the semiconductor junction. To produce the bipolar junction transistor, a base layer of first conductivity type is provided in a semiconductor substrate, ions of second conductivity type implanted through the base layer surface in portions of the base layer surface increasing in area from a central portion of the base layer surface laterally towards outer portions of the base layer surface, and the implanted ions diffused into the base layer to thereby create the emitter region and the concave semiconductor junction. Preferably, the ions are implanted by depositing an oxide or other masking layer on the base layer, selectively etching the masking layer to expose the plurality of surface portions, and then implanting the ions into the exposed surface portions.

8 Claims, 3 Drawing Sheets

005,872,391

BIPOLAR JUNCTION TRANSISTORS HAVING AN INCREASED SAFE OPERATING AREA

FIELD OF THE INVENTION

The present invention relates to semiconductor devices, in particular, to bipolar junction transistors and fabrication methods therefor.

BACKGROUND OF THE INVENTION

Bipolar junction transistors (BJTs) are commonly operated as switching element. Current flowing between the collector and emitter nodes of a BJT is switched by switching the current flowing through the base node of the transistor on and off, driving the transistor between saturated and cutoff states. The current capability in the "on," i.e., saturated, state is generally proportional to the area of the emitter. Accordingly, it generally is desirable to provide the largest possible emitter area in order to increase the saturation current capacity of the transistor.

FIGS. 1 and 2 illustrate a typical npn-type BJT according to the prior art. An N epitaxial layer 20 lies upon an $N^+$ substrate 10, with a P base layer 30 lying on the N epitaxial layer 20. An $N^+$ emitter region 40 is provided in the P base layer 30, on which an emitter terminal 50 is formed. A base terminal 52 is located on the on the base layer 30, spaced apart from the emitter terminal 50. A collector terminal 54 is formed on the substrate 10. For the on state illustrated in FIG. 1, the p-n junctions of the device are forward biased, i.e., the collector terminal 54 is positive with respect to the emitter terminal 50. The current at the periphery of the emitter region 40 typically is higher than the current at the center of the emitter region 40, as indicated by the broad and narrow arrows.

Turning the switching transistor off involves reverse biasing the p-n junction between the base layer 30 and the emitter region 40 to cutoff the current flowing between the collector terminal 54 and the emitter terminal 50. As the junction is reverse-biased, a depletion region in the base layer 30 shifts from just beneath the base terminal 52 towards the center of the emitter region 40, blocking current flow between the base terminal 52 and the collector terminal 54.

This shift is not instantaneous, however, and during the finite time it takes for the depletion layer to shift and block the current flow, current may become concentrated toward the center of the emitter region 40, as indicated by the broad arrow in FIG. 2. This current concentration phenomena tends to be exacerbated if the transistor is being used to switch an inductive load, as current from the inductive load tends to keep the emitter current constant as the conductive area of the emitter region 40 decreases. The current concentration generally causes heating in the central portion of the emitter region 40, which in turn tends to increase current density in the central portion of the emitter region 40 and cause even more heating. If the temperature rise induced by current crowding is high enough, it can permanently damage the transistor, a failure mechanism often referred to as reverse bias second breakdown. Reverse bias second breakdown may limit the envelope of voltage and current in which the transistor may be operated, referred to as the Safe Operating Area (SOA) of the transistor.

Current crowding and associated problems can increase as the area of the emitter region 40 increases, as increasing the area of the emitter region 40 tends to increase the time to required to reverse-bias the emitter-base junction. Thus, although increasing the area of the emitter region 40 can increase the current carrying capability of the transistor in the on state, it can also reduce the SOA of the transistor. Solutions to the current crowding associated with reverse bias second breakdown have been proposed in U.S. Pat. No. 4,388,634 to Amantea et al. (describing a BJT with a collector with profiled doping) and U.S. Pat. No. 4,416,708 to Abdoulin et al. (describing a bipolar transistor having an toothed emitter structure).

SUMMARY OF THE INVENTION

In light of the foregoing, it is an object of the present invention to provide bipolar junction transistors which exhibit reduced current crowding upon turnoff, and fabrication methods therefor.

It is another object of the present invention to provide BJTs having increased Safe Operating Area (SOA), and methods of fabrication therefor.

These and other objects, features and advantages are provided, according to the present invention, by bipolar junction transistors and methods for fabricating therefor wherein a generally concave semiconductor junction is provided between emitter and base regions, the generally concave semiconductor junction having an apex oriented towards and substantially centered with respect to an emitter terminal contact area on the opposite surface of the emitter region. The emitter region may include a plurality of contiguous emitter subregions extending from the surface of the emitter region to the base region. Preferably, a plurality of subregions extends to the base region in an arcuate manner and merges to form the generally concave semiconductor junction. By providing a concave emitter-base junction with respect to the emitter terminal of the device, the present invention can reduce current crowding in central regions of the emitter region as the emitter-base junction is reversed biased, thus preventing reverse bias second breakdown and increasing the SOA of the transistor.

In particular, according to the present invention, a bipolar junction transistor includes a semiconductor substrate having a surface, a base region of first conductivity type in the substrate, and an emitter region of second conductivity type extending from the surface into the base region to form a generally concave semiconductor junction having an apex oriented towards the surface. The emitter region preferably includes a plurality of contiguous emitter subregions, each of the emitter subregions extending from the surface into the base region to form the generally concave semiconductor junction. Preferably, the plurality of contiguous emitter subregions includes a plurality of emitter subregions extending from the surface into the base region in an arcuate manner and merging to form the generally concave semiconductor junction. The transistor may also include a collector region of second conductivity type in the substrate, the collector region electrically contacting the base region to thereby form a second semiconductor junction positioned opposite the first semiconductor junction. The transistor also preferably includes an emitter terminal electrically contacting the emitter region at an emitter contact area on the substrate surface, the emitter contact area having a central portion substantially centered with respect to the apex of the generally concave semiconductor junction.

According to a method aspect of the present invention, a base layer of first conductivity type is provided in a semiconductor substrate, the base layer having a surface having a central portion and outer portions disposed laterally from the central portion. Ions of second conductivity type are implanted through the base layer surface in discrete concentrations increasing from the central portion of the base layer surface laterally towards the outer portions of the base layer surface. The implanted ions are diffused into the base layer to thereby create an emitter region of second conductivity type which extends into the base layer and forms a generally concave semiconductor junction having an apex oriented towards the surface of the base layer. The ions preferably are implanted in a plurality of discrete portions of the surface of the base layer, the portions increasing in area from the central portion of the base layer surface laterally towards the outer portions of the base layer surface. The step of implanting may be preceded by depositing a masking layer on the base layer and etching the masking layer to expose the plurality of portions of the base layer surface, and the step of implanting ions may include implanting ions of the second conductivity type into the exposed base layer surface portions. The step of implanting ions may be followed by the step of removing the masking layer from the base layer. The step of removing the masking layer may be followed by the step of joining an emitter terminal to the emitter region at an emitter contact area of the base layer surface, the emitter contact area having a central portion substantially centered with respect to the apex of the generally concave semiconductor junction.

The semiconductor junctions and methods described herein may also be used for semiconductor devices other than BJTs. The junctions and methods described herein may be used for p-n junctions in devices other than BJT's, for example, in diodes, triacs, gate-turnoff devices and the like. The methods described herein may be also used to produce semiconductor junctions other than p-n junctions, such as semiconductor-metal junctions. In addition, the invention is applicable to forming generally convex junctions between regions of the same conductivity type but having different dopant concentrations, to produce a desired conductivity profile.

BRIEF DESCRIPTION OF THE DRAWINGS

Some of the objects and advantages of the present invention having been stated, others will be more fully understood from the detailed description that follows and by reference to the accompanying drawings in which.

DETAILED DESCRIPTION

Figure 1:
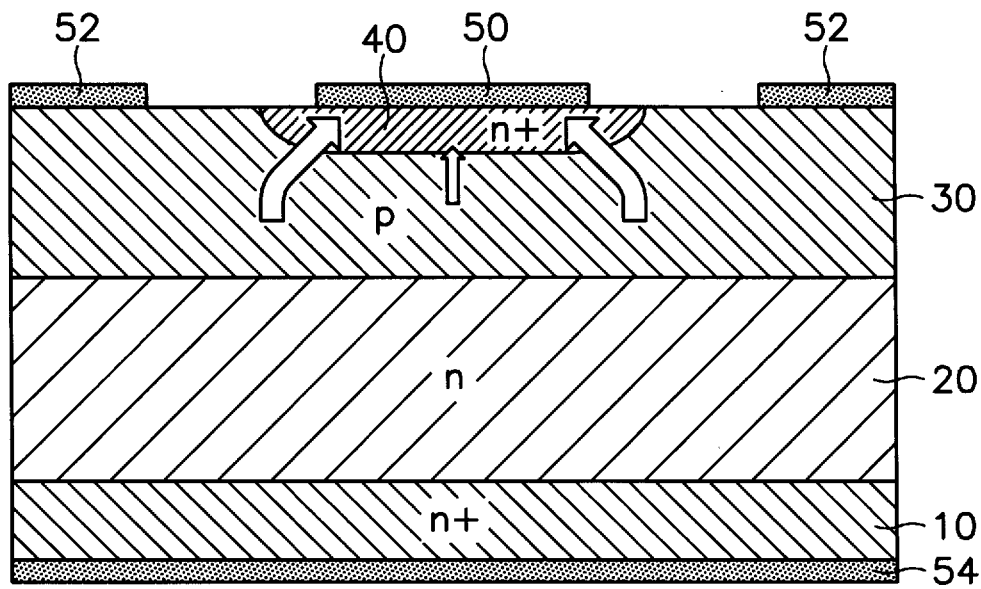
FIG. 1 illustrates a BJT according to the prior art in an on state.
Figure 2:
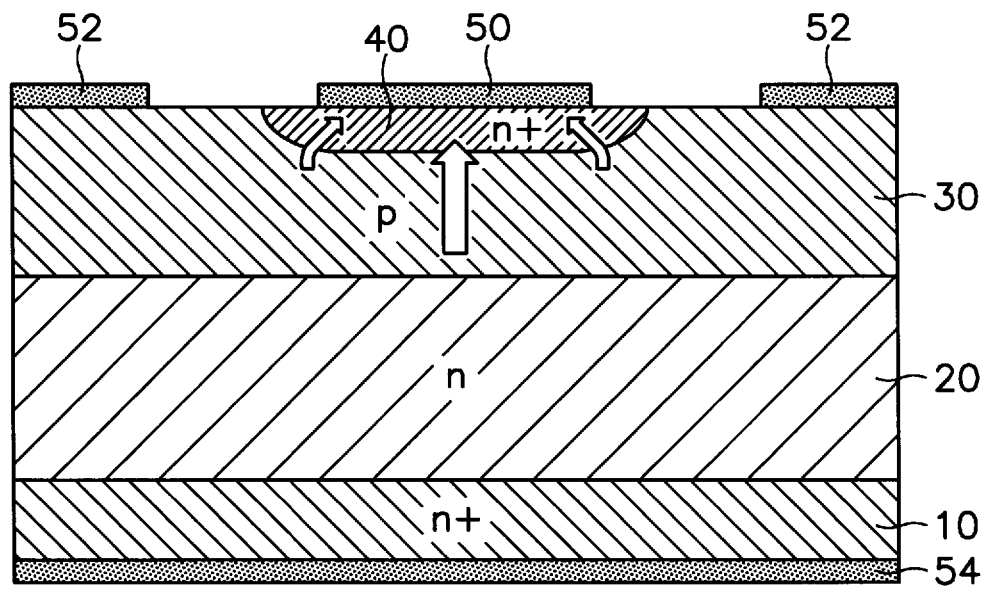
FIG. 2 illustrates a BJT according to the prior art in transitioning to an off state.

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

In the drawings, the thickness of layers and regions are exaggerated for clarity, and like numbers refer to like elements throughout.

For purposes of illustration, the description which follows relates to an embodiment of an npn-type bipolar transistor according to the present invention. Those skilled in the art will appreciate that the present invention also includes bipolar transistors including regions of opposite polarities to those described herein. Those skilled in the art will also understand the semiconductor junctions and fabrication methods described herein are also applicable to other semiconductor devices.

Figure 3:
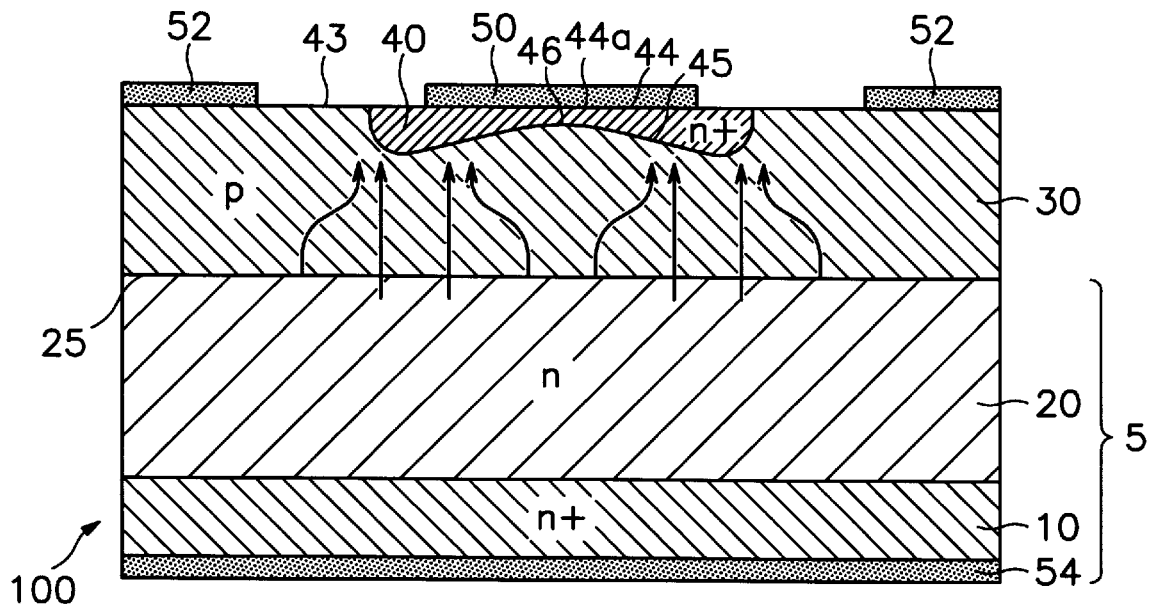
FIG. 3 illustrates a cross-sectional view of a bipolar transistor according to the present invention.

FIG. 3 illustrates an embodiment of a bipolar junction transistor according to the present invention, in particular, an npn-type embodiment. A semiconductor substrate 100 has a surface 43. A P-type base region 30 is formed in the substrate 100. An $N^+$-type emitter region 40 extends from the surface 43 into the base region 30 to form a generally concave semiconductor junction 45, having an apex 46 oriented toward the surface 43. An emitter terminal 50 contacts the emitter region 40 at a emitter contact surface area 44, preferably having a central portion 44a substantially centered with respect to the apex 46 of the concave semiconductor junction 45. As illustrated, a collector region 5, including N-type and $N^+$-type semiconductor collector subregions 10,20 is also provided in the substrate 100, contacting the base region 30 to form a second semiconductor junction 25 positioned opposite the concave semiconductor junction 45. A base terminal 52 is provided, contacting the base layer 30 and spaced apart from the emitter terminal 50. A collector terminal 54 contacts the collector region 5.

Figure 5:
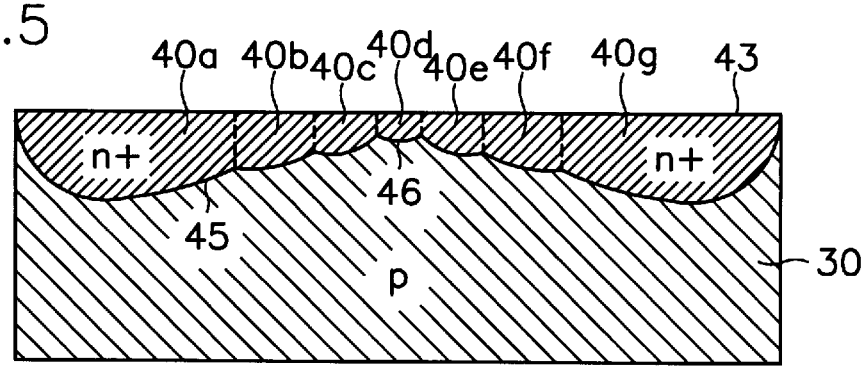

FIG. 5 illustrates the concave semiconductor junction 45 in greater detail, showing portions of the base region 30 and the emitter region 40 of the substrate 100 illustrated in FIG. 3. The emitter region 40 is shown as including a plurality of contiguous emitter subregions 40a–40g, which extend from the surface 43 of the substrate 100 into the base region 30. Preferably, the emitter subregions 40a–40g extend into the base region, preferably in an arcuate manner, merging to form the concave semiconductor junction 45. Thus, the transverse cross-section of the concave semiconductor junction has a distinctive profile, including a plurality of segments 45a–45g which are generally convex with respect to the surface 43.

Figure 6A:
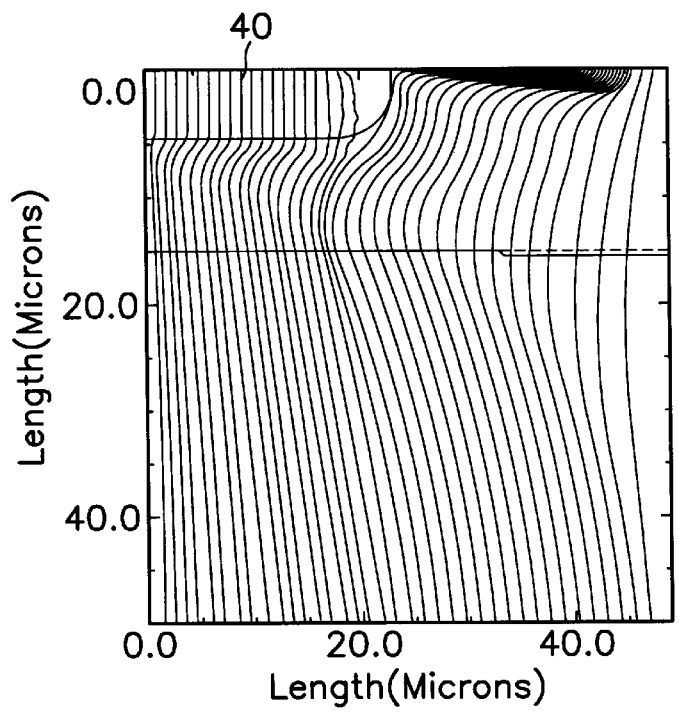
FIG. 6A illustrates current density for a BJT according to the prior art.
Figure 6B:
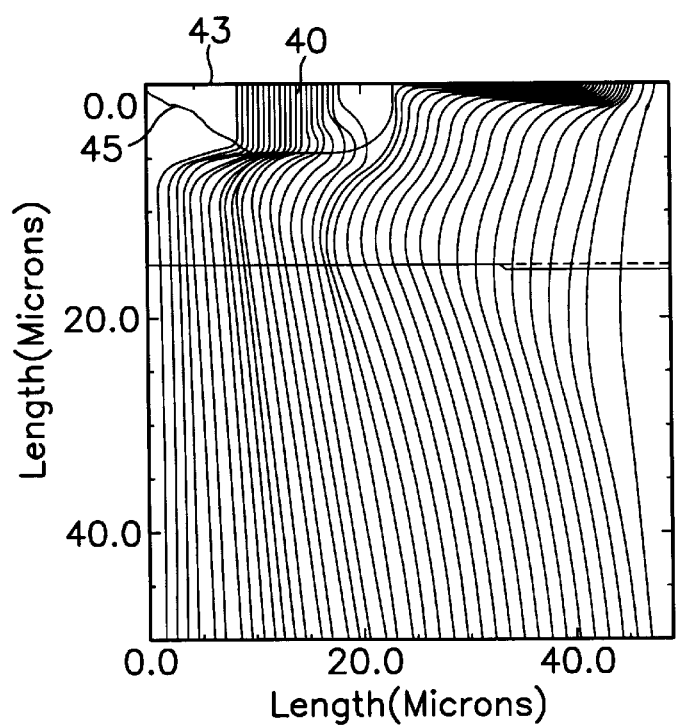
FIG. 6B illustrate current density for a BJT according to the present invention.

Referring back to FIG. 3, by providing the concave semiconductor junction 45 centered with respect to the emitter contact surface 44, current crowding associated with reverse bias second breakdown may be reduced. During reverse biasing of the semiconductor junction 45, current is distributed away from the center of the emitter region 40 towards the outer portions of the emitter region 40, as indicated by the arrows in FIG. 3. As illustrated in detail in FIGS. 6A and 6B, which provide a comparison of current flows in a prior art BJT (FIG. 6A) and a BJT according to the present invention (FIG. 6B), current density in central portions of the device having a generally convex emitter-base junction 45 according to the present invention is less than the current density in the central regions of the prior art BJT. Those skilled in the art will appreciate that be decreasing the current density in the central portions of the emitter, the present invention can provide a BJT with increased SOA.

Figure 4:
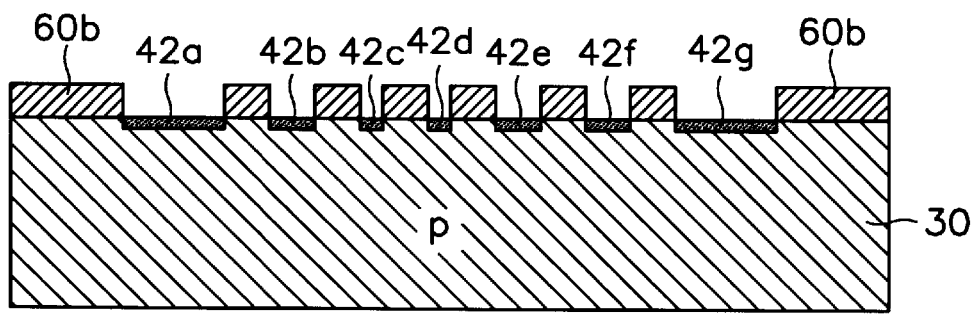
FIGS. 4–5 illustrate operations for producing a bipolar junction transistor according to the present invention.

FIGS. 4 and 5 illustrate operations for producing a semiconductor junction according to the present invention. As shown in FIG. 4, an oxide or other masking layer 60 is deposited on a P-type base layer 30 of first conductivity type, and then etched to expose surface portions 42a–42g of the underlying base layer 30. The etching is selectively performed, for example, using a photomask, such that the exposed surface portions 42a–42b are increasingly larger in area moving laterally from the central portion 60a of the masking layer 60 to outer portions 60b of the masking layer 60. Ions of a first conductivity type are then implanted in the exposed surface portions 42a–42g.

As illustrated in FIG. 5, the implanted ions are then diffused in the base layer 30 to produce an emitter region 40 and a generally convex semiconductor junction 45 having an apex 46 oriented towards the surface 43. The emitter region 40 preferably includes a plurality of emitter subregions 40a–40g extending from the surface 43 into the base layer 30. Because of the nature of the diffusion process, the subregions 40a–40g extend into the base layer in an arcuate matter, with greater penetration of the diffused ions into the outer portions of the layer 30. The subregions 40a–40g merge to form the convex semiconductor junction 45. In transverse cross-section, the concave semiconductor junction 45 includes a plurality of segments 45a–45g which are generally convex with respect to the surface 43. Those skilled in the art will understand that fewer or greater subregions may be employed with the present invention, depending the smoothness of the semiconductor junction 45 desired. For example, increasing the number of the surface portions exposed by the etching step may produce a convex semiconductor junction 45 more closely approaching a true convex curve.

Those skilled in the art will understand that, although the above-described devices and methods pertain to bipolar junction transistors, the invention is applicable to other semiconductor devices in which a similarly-shaped current distribution between a semiconductor junction and another material junction is desired. Similar p-n semiconductor junctions may be formed in semiconductor devices other than BJT's, for example, diodes, triacs, gate-turnoff devices and the like. In addition, the invention is applicable to forming generally convex junctions between regions of the same conductivity type but having different dopant concentrations, to produce a conductivity profile and a current distribution similar to that discussed above. For example, a collector having a concave conductivity profile may be provided in a BJT in order to reduce current concentration in a particular region of the device.

In the drawings and specification, there have been disclosed typical embodiments of the invention and, although specific terms are employed, they are used in a generic and descriptive sense only and not for purposes of limitation, the scope of the invention being set forth in the following claims.

That which is claimed:

1. A bipolar junction transistor, comprising:

a semiconductor substrate having a surface;

a base region of first conductivity type in said substrate;

a ring-shaped base terminal electrically contacting said base region;

an emitter region of second conductivity type within said ring-shaped base terminal, extending from said surface into said base region to form a generally concave segmented semiconductor junction having an apex within said rind-shaped base terminal oriented towards said surface; and an emitter terminal within said ring-shaped base terminal electrically contacting said emitter region at an emitter contact area having a central portion within said ring-shaped base terminal substantially centered with respect to said apex of said generally concave segmented semiconductor junction within said ring-shaped base terminal.

2. A transistor according to claim 1 wherein said emitter region comprises a plurality of contiguous emitter subregions which extend from said surface into said base region to define said generally concave segmented semiconductor junction.

3. A transistor according to claim 2 wherein said plurality of contiguous emitter subregions comprises a plurality of emitter subregions which extend from said surface into said base region in an arcuate manner.

4. A transistor according to claim 1 further comprising a collector region of second conductivity type in said substrate, said collector region electrically contacting said base region to thereby form a second semiconductor junction positioned opposite said semiconductor junction.

5. A semiconductor device, comprising:

a first region;

a ring-shaped terminal electrically contacting said first region;

a second region contacting said first region to form a generally concave segmented semiconductor junction within said ring-shaped terminal, wherein said generally concave semiconductor junction has an apex within said ring-shaped terminal; and a third region within said ring-shaped terminal contacting said second region at a contact surface within said ring-shaped terminal, having a central portion within said ring-shaped terminal and positioned opposite said generally concave segmented semiconductor junction such that said central portion is substantially centered with respect to said apex within said ring-shaped terminal.

6. A device according to claim 5 wherein said second region comprises a plurality of contiguous subregions which extend from said contact surface into said first region to define said generally concave segmented semiconductor junction.

7. A device according to claim 6 wherein said plurality of contiguous subregions comprises a plurality of subregions which extend from said contact surface into said first region in an arcuate manner.

8. A device according to claim 5 wherein said first region comprises a first semiconductor region of first conductivity type, wherein said second region comprises a second semiconductor region of second conductivity type, and wherein said third region comprises a conductive region.

* * * * *